United States Patent
Chen et al.

(10) Patent No.: US 10,856,437 B2
(45) Date of Patent: Dec. 1, 2020

(54) SYSTEM FOR AUTOMATICALLY CLASSIFYING ELECTRICAL DEVICES FOR FAN CONTROL APPLICATION

(71) Applicant: QUANTA COMPUTER INC., Taoyuan (TW)

(72) Inventors: Chao-Jung Chen, Taoyuan (TW); Yi-Chieh Chen, Taoyuan (TW); Yueh-Chang Wu, Taoyuan (TW); Ming-Chin Huang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/039,808

(22) Filed: Jul. 19, 2018

(65) Prior Publication Data
US 2019/0239385 A1   Aug. 1, 2019

Related U.S. Application Data

(60) Provisional application No. 62/623,731, filed on Jan. 30, 2018.

(51) Int. Cl.
*H05K 7/20* (2006.01)
*G06F 1/20* (2006.01)
*G06F 1/3234* (2019.01)
*G06F 1/3221* (2019.01)
*G06F 1/3287* (2019.01)

(52) U.S. Cl.
CPC ......... *H05K 7/20209* (2013.01); *G06F 1/206* (2013.01); *G06F 1/325* (2013.01); *G06F 1/3221* (2013.01); *G06F 1/3287* (2013.01); *H05K 7/20136* (2013.01); *H05K 7/20727* (2013.01); *H05K 7/20836* (2013.01)

(58) Field of Classification Search
None
See application file for complete search history.

(56) References Cited

U.S. PATENT DOCUMENTS 5,926,386 A * 7/1999 Ott .................. H02P 23/0077
                                                318/471
9,207,732 B1 * 12/2015 Chen ..................... G06F 1/206
(Continued)

FOREIGN PATENT DOCUMENTS

CN    1812237 A    8/2006
CN  106445027 A    2/2017
(Continued)

OTHER PUBLICATIONS

Extended European Search Report for EP Application No. 18201984.4, dated Apr. 12, 2019.
(Continued)

*Primary Examiner* — Ziaul Karim
(74) *Attorney, Agent, or Firm* — Nixon Peabody LLP

(57) ABSTRACT

A system and method to control fan power for an electronic device based on cooling requirements is disclosed. The electronic device includes a power supply unit and a fan coupled to the power supply unit. A controller is coupled to the fan. The device includes at least one electronic component cooled by the fan. The controller is operable to classify the at least one electronic component, and regulate the power supplied to the fan based on the classification of the at least one electronic component.

13 Claims, 4 Drawing Sheets

(56) References Cited

U.S. PATENT DOCUMENTS

| | | | |
|---|---|---|---|
| 9,760,071 B2* | 9/2017 | Bhattacharyya | G05B 15/02 |
| 2004/0016901 A1* | 1/2004 | Materniak | D06M 13/262 |
| | | | 252/8.62 |
| 2006/0016901 A1 | 1/2006 | Beitelmal et al. | |
| 2008/0278905 A1* | 11/2008 | Artman | G06F 1/206 |
| | | | 361/679.31 |
| 2012/0084551 A1* | 4/2012 | Cheng | G06F 1/206 |
| | | | 713/2 |
| 2013/0258582 A1* | 10/2013 | Shelnutt | G06F 1/206 |
| | | | 361/679.48 |
| 2016/0050789 A1* | 2/2016 | Bhattacharyya | G05B 15/02 |
| | | | 700/282 |
| 2016/0266560 A1* | 9/2016 | Chou | G05B 19/042 |
| 2018/0011521 A1* | 1/2018 | Ingalls | G06F 1/206 |

FOREIGN PATENT DOCUMENTS

| | | |
|---|---|---|
| JP | 2001-085882 A | 3/2001 |
| JP | 2009-238020 A | 10/2009 |
| TW | 568300 | 12/2003 |

OTHER PUBLICATIONS

TW Office Action for Application No. 107133465, dated Sep. 18, 2019, w/ First Office Action Summary.
TW Search Report for Application No. 107133465, dated Sep. 18, 2019, w/ First Office Action.
JP Office Action for Application No. 2018-214006, dated Nov. 26, 2019, w/ First Office Action Summary.
JP Office Action for Application No. 2018-214006, dated Jun. 2, 2020, w/ Second Office Action Summary.

* cited by examiner

SYSTEM FOR AUTOMATICALLY CLASSIFYING ELECTRICAL DEVICES FOR FAN CONTROL APPLICATION

CROSS-REFERENCE TO RELATED APPLICATIONS

This application claims priority to and the benefit of U.S. Provisional Application No. 62/623,731, entitled "AUTOMATICALLY CLASSIFY ELECTRIC DEVICE FOR FAN CONTROL APPLICATION" and filed on Jan. 30, 2018, the contents of which are hereby incorporated by reference in their entirety as if fully set forth herein.

TECHNICAL FIELD

The present disclosure relates generally to cooling systems for electronic devices, and more specifically to a system to regulate fan power based on the type of components in an electronic device.

BACKGROUND

Electronic devices such as servers include electronic components that are connected to a power supply unit. Servers generate an enormous amount of heat due to the operation of internal electronic components such as controllers, processors, LAN cards, hard disk drives, and solid state disk drives. Overheating from the inefficient removal of such heat has the potential to shut down or impede the operation of such devices. Thus, servers are designed to rely on air flow through the interior of the device to carry away heat generated from electronic components. Servers often include various heat sinks that are attached to the electronic components such as processing units. Heat sinks are typically composed of thermally conductive material. Heat sinks absorb the heat from the electronic components, thus transferring the heat away from the components. The heat from heat sinks must be vented away from the server. Airflow to vent away such heat is often generated by a fan system that accelerates airflow through the components and the heat sink. The generated airflow thus carries collected heat away from the components and the heat sink.

In devices such as servers, the system power is limited by the thermal design for cooling such components. Thus, the operating velocity of such devices is constrained by the thermal design, as components must sometimes be run at lower velocities so they don't overheat. By the principles of energy conversion, the power limitation of a fan cooled device is proportional to the air quantity flowing through the device. The greater the air quantity, the more air flow is available for cooling, and therefore the performance of the system may be increased. High system power allows for higher power to be distributed to components, such as a CPU, thereby resulting in increased calculation speed. Of course, greater air flow requires greater fan power and therefore increases power requirements of the device. Various types of fans are used to provide adequate cooling, and different fan control mechanisms balance the cooling capacity and generated noise.

Since fan noise increases exponentially with fan rotation speed, reducing rotations per minute (RPM) by a small amount potentially results in a large reduction in fan noise. However, if the fan speed is reduced too much, components may overheat. One technique of modulating fan power, is using a pulse width modulation control signal. Pulse width modulation (PWM) turns the power supply to fan on and off at a fixed frequency. Duty-cycle adjustments are made to control the speed of the fan. The larger the duty cycle, the faster the fan spins. A proper frequency must be selected since if the signal frequency is too slow, the fan's speed will noticeably oscillate within a PWM cycle. The frequency can also be too high, as commutation is done electronically using circuits that are powered by the fan's plus and minus terminals. Using PWM with the fan (and therefore the internal commutation electronics) too quickly can cause the internal commutation electronics to cease functioning correctly. Thus, useful frequencies range from 20 Hz to 160 Hz. In addition, the PWM rise and fall times must be sufficiently slow to ensure long-term reliability of the fan.

However, the cooling requirements for different components may differ. Such requirements are typically found in a product specification for the respective component such as a processor, a circuit card, or a memory device. In present devices, the general cooling solution is to focus on the worst case requirement, and apply the fan power to all cases with the same fan control parameters. This method is workable to make sure all components meet their respective thermal specifications. However, simply setting a fan power level to meet the worst case thermal requirements is not efficient for saving energy or reducing fan noise.

There is therefore a need for a fan control system that allows sufficient cooling of device components but minimizes energy consumption. There is a further need for a system that can classify components and alter fan duty cycles to ensure sufficient cooling for specific components. There is also another need for a fan control system that can minimize fan noise based on minimizing fan rotation speed.

SUMMARY

One disclosed example is an electronic device having adaptable cooling. The electronic device includes a power supply unit and a fan coupled to the power supply unit. A controller is coupled to the fan. The device includes at least one electronic component cooled by the fan. The controller is operable to classify the at least one electronic component, and regulate the power supplied to the fan based on the classification of the at least one electronic component.

Another example is a method to regulate fan operation to cool an electronic device. The electronic device includes a power supply unit and a fan coupled to the power supply unit. Device classification data and fan control data are stored in a memory device. At least one electronic component in the electronic device is classified. The power supplied to the fan from the power supply unit is regulated based on the classification of the at least one electronic component.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings, in which.

Figure 1A:
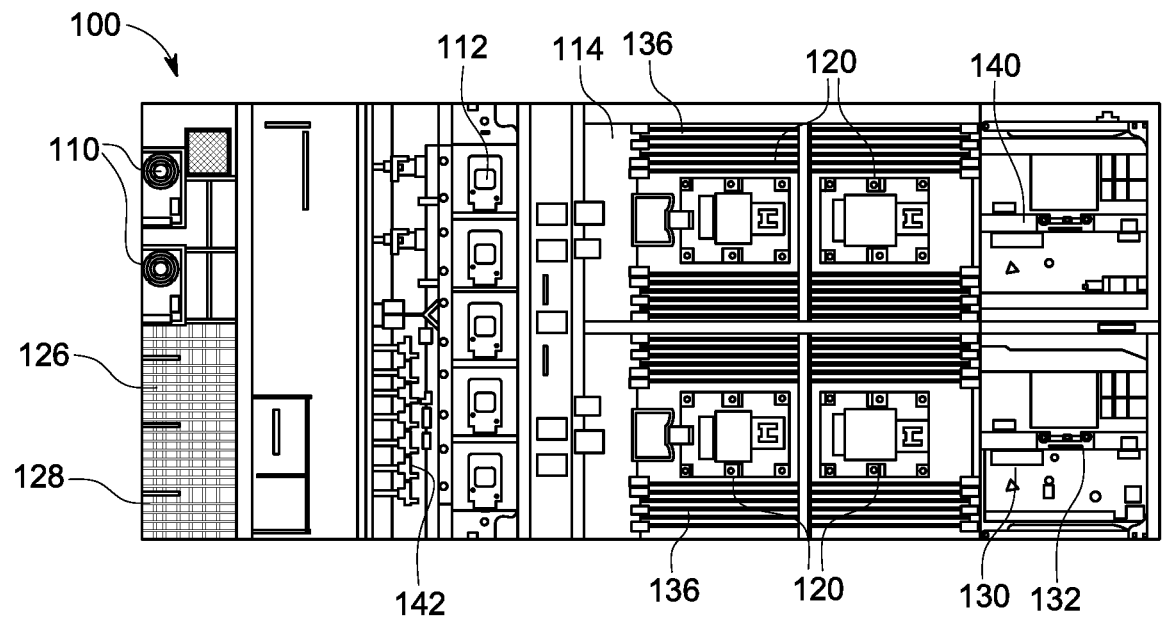
FIG. 1A is a perspective view of the electronic components of an example device such as a server.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements, and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

FIG. 1A is a block diagram of an example network device such as a server 100. The server 100 includes power supply units 110 and fans 112. The power supply units 110 supply electrical power to different electronic components on the server 100. The server 100 includes numerous electronic components that are mounted on a motherboard 114. The electronic components generate heat when powered on. The electronic components each have separate thermal cooling requirements to maintain operation. In this example, the electronic components include processors 120. Other components include a hard disk drive (HDD) 126, and a solid state disk drive (SSD) 128. The server 100 includes device sockets for additional integrated circuits and slots for the insertion of circuit cards. Each such inserted component also generates heat and requires cooling to operate. In this example, other inserted components include a series of Peripheral Component Interconnect Express (PCIE) circuit cards 130 and a series of Open Compute Project (OCP) circuit cards 132 that are inserted in a respective slot. Optional devices such as a FPGA or a LAN card may be inserted in other device sockets. A series of DIMM memory devices 136 are also provided in sockets in proximity to the processors 120.

The server 100 also includes a baseboard management controller (BMC) 140 that monitors power data and other support for the electronic components of the server 100. The server also includes a chassis management controller CMC 142 that controls the output from the power supply unit 110 and the fan 112. It is to be understood that there may be multiple electronic components of the same type. For example, the motherboard 114 of the server 100 may include additional sockets or slots for receiving additional components such as processors, cards, memory devices and the like. The different configurations of possible electronic components that may be installed in the server 100 each have different thermal cooling requirements.

Figure 1B:
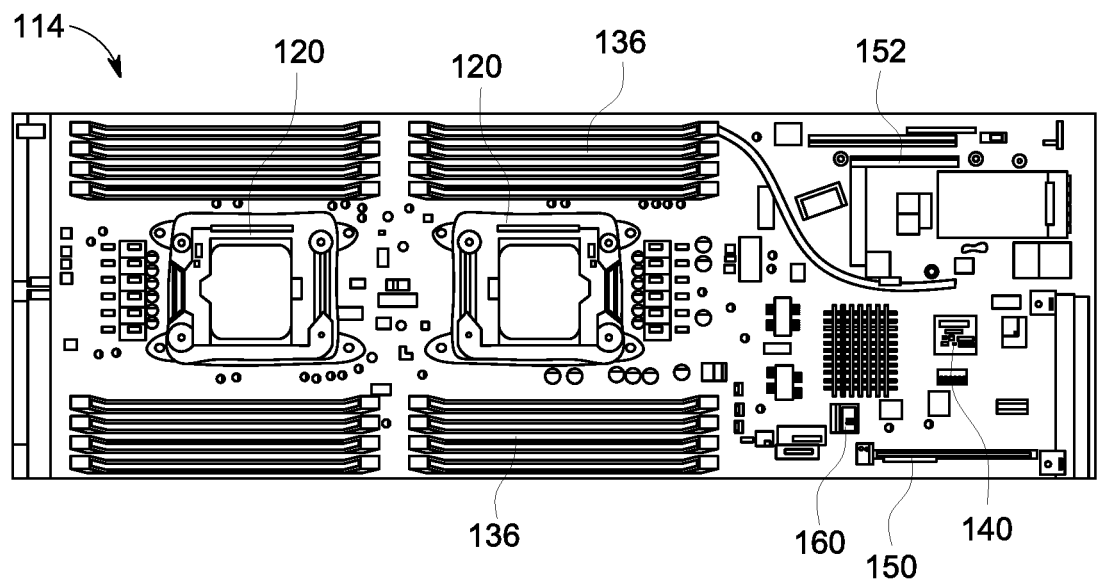
FIG. 1B is a block diagram of electronic components on the server in FIG. 1A that have different cooling requirements.

FIG. 1B is a block diagram of the electronic components of the motherboard 114 of the server 100 in FIG. 1A. Like elements in FIG. 1B are labeled with equivalent element numbers in FIG. 1A. As may be seen in FIG. 1B, the mother board 114 also includes open PCIE slots 150 and OCP slots 152 that allow for the addition of other components that change the thermal cooling requirements of the server 100. As will be explained below, in this example, the BMC 140 and CMC 142 allows the adjustment of power for the fans 112 in FIG. 1A to optimize cooling and adapt the cooling level when new components are added or when components are removed from the motherboard 114. It should be understood, that any suitable controller with appropriate software or firmware may allow adjustment of the fans 112 according to the principles explained below. The processors 120 may access BIOS memory 160. As may be understood, on power up, the BIOS 160 runs a device identification routine to determine electronic components on the motherboard 114.

Each of the different product specifications for different components, such as processors, memory devices, and cards, includes thermal requirements for cooling. In the present example, different techniques may be applied for adjusting fan power levels to provide efficient cooling of the server 100. One technique may include HDD/SSD type and quantity auto classification. Another technique is auto classification of PCIE cards and OCP cards. As will be explained, the classification techniques described herein may be performed by software or firmware run by any suitable controller or processor. By a software or firmware assisted auto classification mechanism, different fan speeds may be defined for each type of electronic component on a device accordingly. The fan speed may be used to control the power to the fans 112, and therefore result in power saving and reducing acoustical vibration from excessive fan operation. In this example, the fans 112 are grouped together in two fan zones allowing more targeting cooling and associated power settings. Thus, the same fan speed is used for two fans in a first fan zone while a different fan speed may be used for two fans in a second fan zone. Of course, with different organization, the fan speeds for each of the fans 112 may be controlled separately.

An operating memory of the controller that performs the below routine includes a supported components list that is created based on thermal limitations of the electronic components that may be installed on the devices. Some of components are hard to cool due to high power dissipation and strict thermal requirements. Other components are easier to cool because of low power dissipation and less strict thermal requirements. As a result, the supported components are classified into different levels accordingly. The level classification of components are implemented into a fan control mechanism to change the fan behavior depending on the type of components.

The classification process via firmware or software may be performed in a variety of ways. One example of such classification is a quantity auto detection routine shown in FIG. 2 for determining the quantity of memory devices such as HDDs or SSDs. In this example, the BMC 140 (in FIGS. 1A-1B) receives on board hard disk quantity data, and then passes the information to the CMC 142 (in FIGS. 1A-1B) for fan control of the fan 112. For example, the BIOS 160 may detect how many on board Serial Advanced Technology Attachment (SATA) disk drives are installed. This information may be sent to software running on the BMC 140 for fan control. For example, the BIOS 160 may pass the quantity of hard drives to the BMC 140. The BMC 140 may pass this information to the CMC 142 for fan control. The BMC 140 may execute a procedure to auto classify the devices when installing HDDs or SSDs in the server 100. The BMC 140 (in FIG. 1B) factors the quantity of the classified devices and sends the information to dictate fan control commands made by the CMC 142. The fan control is optimized to reduce needed fan energy to more precisely meet the cooling requirements of the number of the various HDDs and SSDs in the server 100.

Figure 2:
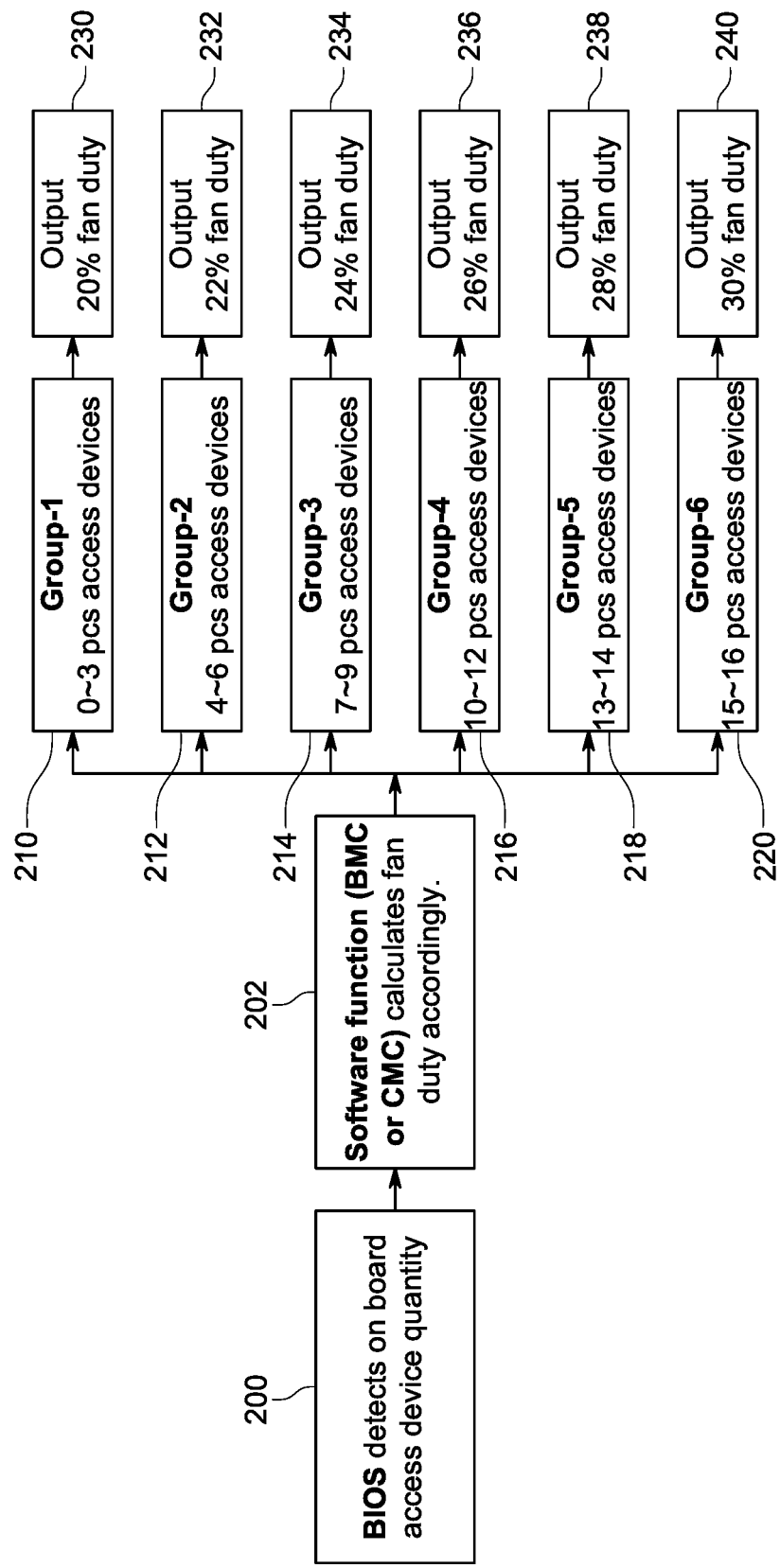
FIG. 2 is a flow diagram of the process of determining fan power requirements based on determining device quantity for disk drives in the server in FIG. 1.

FIG. 2 shows a classification flow chart used to control fan cycle signals for fans that are designed to cool different quantities of memory access devices such as HDDs or SSDs. In this example, a thermal engineer classifies a number of groups, each based on a quantity of devices. A different fan control behavior is assigned to each group based on the quantity of memory access devices in the group. The group information and corresponding fan control data is stored in a memory, such as the internal memory of the BMC 140. The BMC 140 (in FIGS. 1A-1B) first collects the on board device quantity of HDDs such as the HDD 126 or SSDs such as the SSD 128 (in FIGS. 1A-1B) (200). Once the quantity of devices is collected, the BMC 140 accesses the corresponding power levels for fans based on the group that the quantity of devices belongs to. The BMC 140 then sends the corresponding fan control data to the CMC 142. The CMC 142 then determines the appropriate fan duty cycle from the device quantity based on the previously calculated thermal requirements (202).

As explained above, in this example, there are six groups represented by the boxes 210, 212, 214, 216, 218, and 220. The groups represent different numbers of memory access devices that require greater amounts of cooling. Each of the six groups has a corresponding fan duty cycle that is represented by boxes 230, 232, 234, 236, 238, and 240. The duty cycle values in the boxes 230, 232, 234, 236, 238, and 240 are determined based on the thermal requirements of the six groups. For example, a thermal engineer may consult the specifications of the memory access devices and thermal testing results to determine the proper duty cycles for each group. In this example, the fan duty cycles range from 20% to 30%, and represent a range of 8 W to 13 W of power for the fans 112.

The box 210 represents a first group that constitutes 0-3 memory access devices, with the corresponding output box 230 that is a 20% duty cycle for the fans 112. The box 212 represents a second group that constitutes 4-6 memory access devices, with the corresponding output box 232 that is a 22% duty cycle for the fans 112. The box 214 represents a third group that constitutes 7-9 memory access devices, with the corresponding output box 234 that is a 24% duty cycle for the fans 112. The box 216 represents a fourth group that constitutes 10-12 memory access devices, with the corresponding output box 236 that is a 26% duty cycle for the fans 112. The box 218 represents a fifth group that constitutes 13-14 memory access devices, with the corresponding output box 238 that is a 28% duty cycle for the fans 112. The box 220 represents a sixth group that constitutes 15-16 memory access devices, with the corresponding output box 240 that is a 30% duty cycle for the fans 112. From this example, if the quantity of memory devices belongs to the first group, then the fan duty cycle will output at 20%. This may be compared with the sixth group, where the fan duty is higher by 10%, thereby resulting in a power saving of 5 W for the first group.

Different mechanisms may be used to identify memory devices on the motherboard. These mechanisms may include the BIOS function of post ID; the host bus adapter (HBA) of the BMC; and the redundant array of independent disks (RAID) card information. Another example of memory device type classification routine using such mechanisms is shown in the flowchart in FIG. 3. In this example, the BIOS power on self-test (POST) ID routine is used to identify Serial Advanced Technology Attachment (SATA) memory devices. The ID data for such devices is received by either the CMC 142 or the BMC 140 (in FIGS. 1A-1B) to identify the type of access devices for fan control. The routine first determines whether a memory device is present on the motherboard 114. One box 310 represents the case where a memory device such as a SATA HDD device is found on the motherboard 114. A second box 312 represents the case if no memory device is present on the motherboard 114. The routine then determines the presence of different memory control cards. A box 314 represents a situation where there is neither a host bus adapter card nor a RAID card present. A box 316 represents a situation when a vendor-specific host bus adapter card, or a vendor-specific RAID card is present. For example, for certain vendor-specific cards, information may be read from the card, while other non-vendor cards may not have such information. Finally, a box 318 represents a situation where a non-vendor specific host bus adapter card or RAID card is present.

The max duty setting of 75%, as represented by a box 320, is set for the fan power level when there is a memory device on the motherboard 114. The max duty cycle, as represented by a box 322, is set at 100% for the fan where no HBA or RAID card is present. The max duty cycle, as represented by a box 324, is set at 75% for the fan where a non-vendor specific HBA or RAID card is present. When a vendor specific HBA or RAID card is present, the routine determines whether the card includes a SAS hard disk drive, as represented by a box 330, or whether the card does not include a SAS hard disk drive, as represented by a box 332. In the case that the card includes a SAS hard disk drive, the max duty cycle is set to 75% as represented by a box 340 to take into account rotation and vibration index concerns. In the case the card does not include a SAS hard disk drive, the max duty cycle is set to 100% as represented by a box 342 since there are no SAS hard disk drives and thus there are no rotation and vibration index concerns. According to above results, the routine in FIG. 3 automatically classifies the HDD/SSD type and selects different fan behavior. Compared with 312 W consumed by 100% fan duty cycle in this example, the 75% fan duty cycle would have lower fan power consumption such as 145 W. Thus, there is a 167 W power saving benefit via this routine when the lower fan duty cycle is executed.

Figure 4:
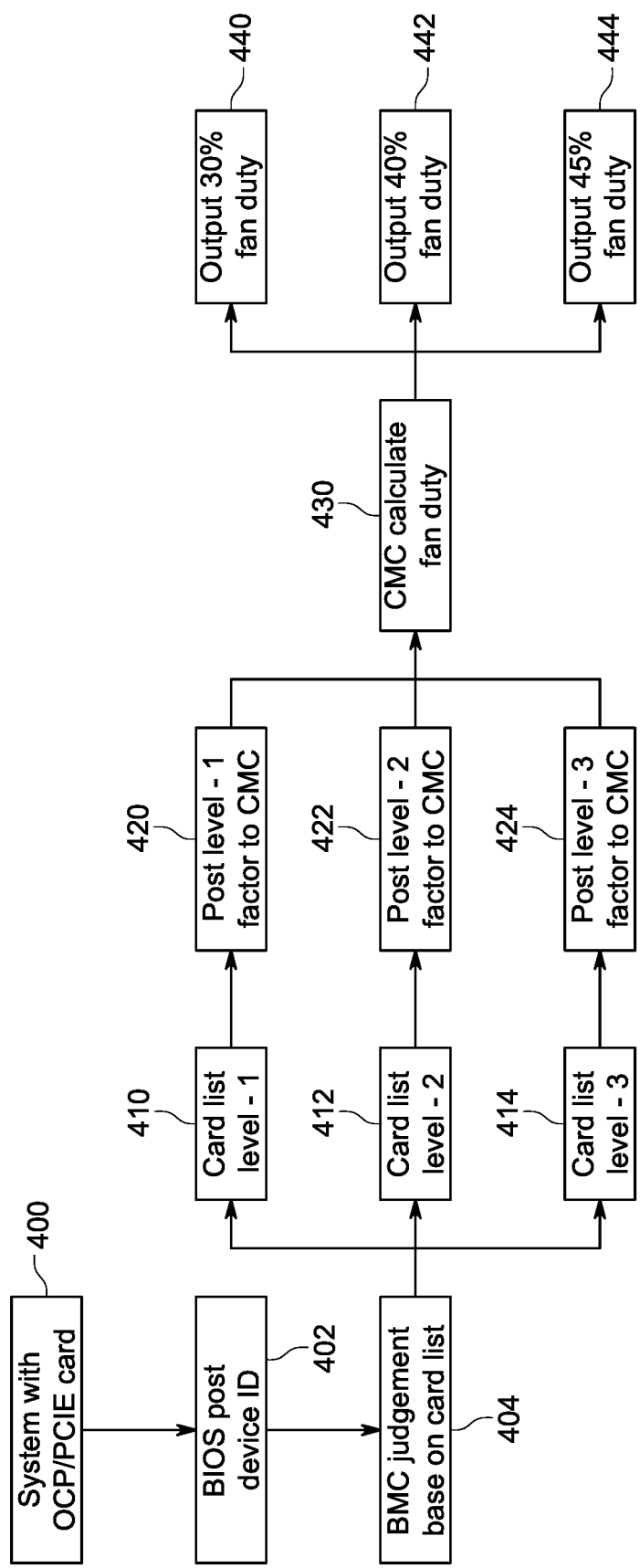
FIG. 4 is a flow diagram of the process of determination of fan power requirements based on determining classification for cards in the server in FIG. 1.

Another classification process to determine the power level for a fan involves PCIE card and OCP card auto classification. FIG. 4 shows the process of PCIE/OCP card type classification for determining a fan power level. A thermal engineer classifies the supported PCIE/OCP cards into one of three levels and assigns different fan control behavior for each level. This correlation is stored in memory for the BMC 140. In this example, the BMC 140 (in FIGS. 1A-1B) first determines whether a PCIE card or OCP card is present (400). The BIOS POST device IDs for the detected cards are sent to the BMC 140 (402). The BMC 140 searches the received device IDs from the stored card list to identify the levels for fan control associated with the cards (404). The card types in this example are classified according to different levels depending on thermal cooling requirements. These levels are represented by box 410 for level 1, box 412 for level 2 and box 414 for level 3. The BMC 140 then sends the level factor to the CMC 142 (in FIGS. 1A-1B). Thus, a level 1 factor is sent for level 1, as represented by a box 420. A level 2 factor is sent for level 2, as represented by a box 422. A level 3 factor is sent for level 3, as represented by a box 424. In this example, the CMC 142 calculates the fan duty cycle based on the received level factor (430). In this example, there may be three fan duty outputs. For level 1, a 30% fan duty cycle is output as represented by a box 440. For level 2, a 40% fan duty cycle is output as represented by a box 442. For level 1, a 45% fan duty cycle is output as represented by a box 444.

By using the BIOS and the BMC 140, the routine in FIG. 4 is able to automatically classify the needed fan power levels when OCP/PCIE cards are installed in the system, and implement these levels into fan control. From the above example, if an OCP/PCIE card that belongs to level 1 is installed, the fan duty cycle will be set at 30%. Compared with a level 3 card, the fan duty is lower 15% duty and power saving of 30 W is realized.

The above examples rely on HDD/SSD type auto classification, HDD/SSD quantity auto classification, and PCIE card/OCP card type auto classification for fan power control. Other devices such as CPUs, GPUs, FPGA, ASICs, may also be classified and fan power control may be adopted for such devices. By such firmware or software assisted auto classifying mechanisms, different fan behaviors may be defined for each type of device that is cooled by each fan or zone of fans on a board. The advantages of correlating fan behavior with the device requirements, compared to traditional solutions, include power saving and lower acoustics during operation of the device.

Figure 3:
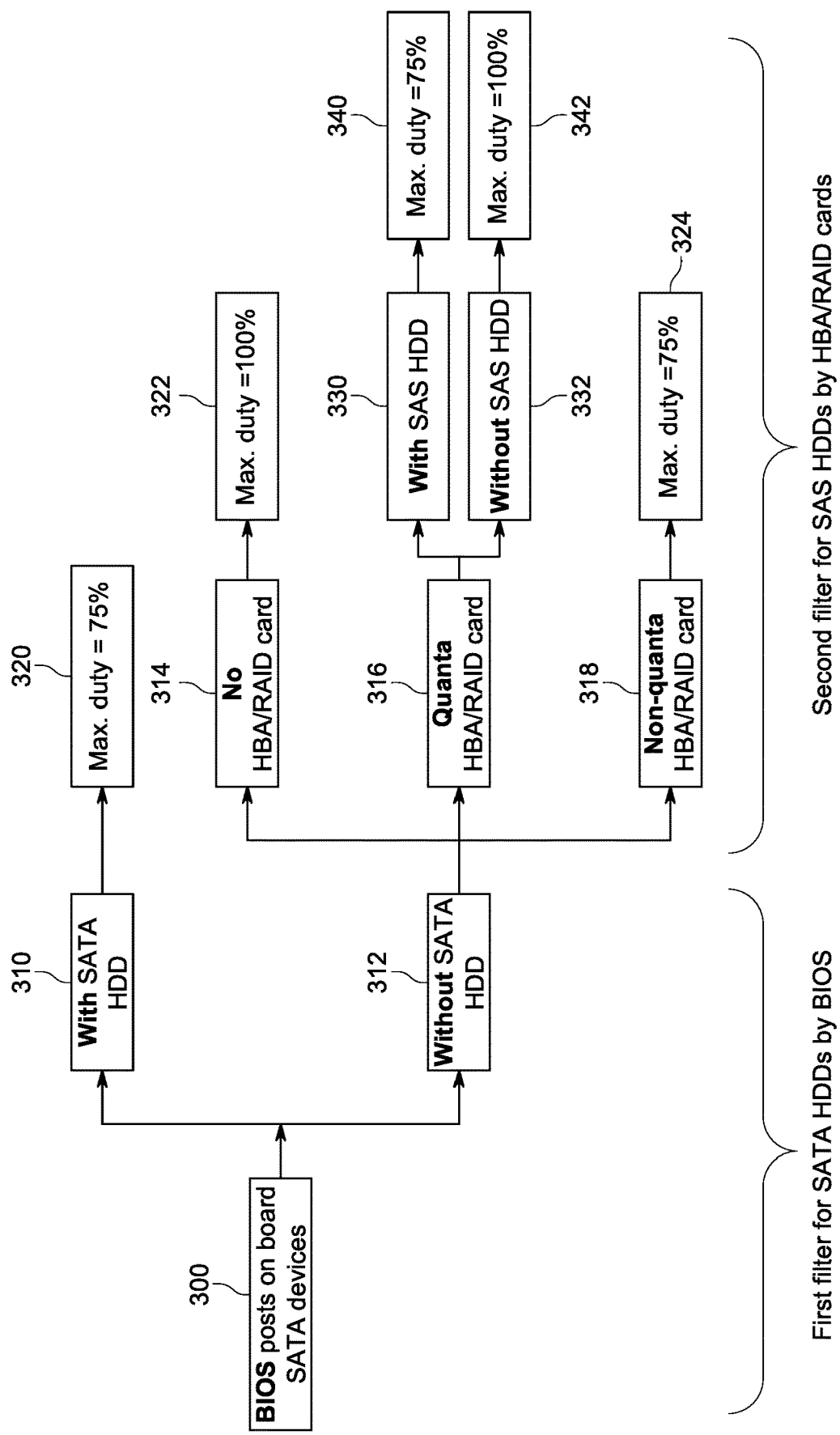
FIG. 3 is a flow diagram of the process of determining fan power requirements based on determining device classification for disk drives in the server in FIG. 1.

The flow diagrams in FIGS. 2-4 are representative of example machine readable instructions for the BMC 140 and CMC 142 (in FIGS. 1A-1B) to set the fan power level. In this example, the machine readable instructions comprise an algorithm for execution by: (a) a processor; (b) a controller; and/or (c) one or more other suitable processing device(s). The algorithm may be embodied in software stored on tangible media such as, for example, a flash memory, a CD-ROM, a floppy disk, a hard drive, a digital video (versatile) disk (DVD), or other memory devices. However, persons of ordinary skill in the art will readily appreciate that the entire algorithm and/or parts thereof can alternatively be executed by a device other than a processor and/or embodied in firmware or dedicated hardware in a well-known manner (e.g., it may be implemented by an application specific integrated circuit (ASIC), a programmable logic device (PLD), a field programmable logic device (FPLD), a field programmable gate array (FPGA), discrete logic, etc.). For example, any or all of the components of the interfaces can be implemented by software, hardware, and/or firmware. Also, some or all of the machine readable instructions represented by the flowcharts of FIGS. 2-4 may be implemented manually. Further, although the example algorithm is described with reference to the flowchart illustrated in FIGS. 2-4, persons of ordinary skill in the art will readily appreciate that many other methods of implementing the example machine readable instructions may alternatively be used. For example, the order of execution of the blocks may be changed, and/or some of the blocks described may be changed, eliminated, or combined.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. An electronic device having adaptable cooling, the electronic device comprising:
 a power supply unit;
 a first fan coupled to the power supply unit;
 at least one electronic component cooled by the first fan;
  an auto-detecting mechanism activated upon powering up the electronic device, whereby an inventory of the category and quantity of said at least one electronic component present in the electronic device can be determined and stored; the auto-detecting mechanism being electronically coupled to a controller coupled to the first fan; and
 a controller coupled to the first fan, the controller operable to:
 classify, without manual intervention, each of the at least one electronic component determined by the auto-detecting mechanism upon powering up the electronic device based upon the category of the at least one electronic component, without considering thermal cooling requirements of each of the at least one electronic component, the category being determined based on design of the at least one electronic component;

auto-regulate the power supplied to the first fan based on classification of each of the at least one electronic component; and the electronic device further comprising another fan coupled to the power supply unit and at least one other electronic component cooled by the another fan, wherein the controller is coupled to the another fan and operative to classify the at least one other electronic component, and auto-regulate the power supplied to the another fan based on the classification of the at least one other electronic component; wherein the classification of the at least one electronic component is based on the quantity and category of the electronic component.

2. The electronic device of claim 1, wherein the at least one electronic component is at least one selected from the group consisting of a hard disk drive (HDD) and a solid state drive (SSD).

3. The electronic device of claim 1, wherein the at least one electronic component is at least one selected from the group consisting of a Peripheral Component Interconnect Express (PCIE) and Open Compute Project (OCP) card.

4. The electronic device of claim 1, wherein the controller is operable to determine the category of component based on data ID obtained by a Basic Input/Output System (BIOS) of the electronic device.

5. The electronic device of claim 1, wherein the at least one electronic component is one of a plurality of electronic components, and the classification of the electronic component is based on the quantity of electronic components on the electronic device.

6. The electronic device of claim 1, wherein the controller is a baseboard management controller.

7. The electronic device of claim 1, wherein the regulation of power to the fan is based on a duty cycle of a pulse width modulation signal.

8. A method to automatically regulate fan operation to cool an electronic device, the electronic device including a power supply unit and a first fan coupled to the power supply unit, the method comprising:

determining the number and category of electronic components in the electronic device upon powering up the electronic device and storing device classification data and fan control data in a memory device;

classifying, without manual intervention, at least one electronic component in the electronic device based upon the category of the at least one electronic component, without considering thermal cooling requirements of the at least one electronic component, the category being determined based on design of the at least one electronic component;

auto-regulating the power supplied to the fan from the power supply unit based on classification and number of the at least one electronic component; and wherein the device includes another fan coupled to the power supply unit and at least one other electronic component cooled by the another fan, wherein the controller is coupled to the another fan and operative to classify the at least one other electronic component, the method further comprising:

classifying the at least one other electronic component; and regulating the power supplied to the another fan based on the classification of the at least one other electronic component; wherein the classification of the at least one other electronic component is based on the quantity and category of the at least one other electronic component.

9. The method of claim 8, wherein the at least one electronic component is at least one selected from the group consisting of a hard disk drive (HDD) and a solid state drive (SSD).

10. The method of claim 8, wherein the at least one electronic component is at least one selected from the group consisting of a Peripheral Component Interconnect Express (PCIE) and Open Compute Project (OCP) card.

11. The method of claim 8, wherein determining the category of the at least one electronic component is based on data ID obtained by a Basic Input/Output System (BIOS) of the electronic device.

12. The method of claim 8, wherein the at least one electronic component is one of a plurality of electronic components, and the classification of the electronic component is based on the quantity of electronic components on the electronic device.

13. The method of claim 8, wherein regulating power to the fan is based on regulating a duty cycle of a pulse width modulation signal.

* * * * *